(12) United States Patent
Ho et al.

(10) Patent No.: US 12,057,856 B2
(45) Date of Patent: Aug. 6, 2024

(54) CALIBRATING DEVICE FOR DIGITAL-TO-ANALOG CONVERSION

(71) Applicant: REALTEK SEMICONDUCTOR CORPORATION, Hsinchu (TW)

(72) Inventors: Hsuan-Ting Ho, Hsinchu (TW); Shih-Hsiung Huang, Hsinchu (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 176 days.

(21) Appl. No.: 17/954,367

(22) Filed: Sep. 28, 2022

(65) Prior Publication Data

US 2023/0108624 A1 Apr. 6, 2023

(30) Foreign Application Priority Data

Oct. 4, 2021 (TW) ................................. 110136937

(51) Int. Cl.
*H03M 1/10* (2006.01)

(52) U.S. Cl.
CPC ................................. *H03M 1/1014* (2013.01)

(58) Field of Classification Search
CPC .... H03M 1/66; H03M 1/0626; H03M 1/0863; H03M 1/1023; H03M 1/1038; H03M 1/1042; H03M 1/1047; H03M 1/12; H03M 1/785; H03M 1/00; H03M 1/007; H03M 1/0624; H03M 1/1028; H03M 1/1033; H03M 1/1057; H03M 1/109; H03M 1/661; H03M 1/68; H03M 1/685; H03M 1/687;

(Continued)

(56) References Cited

U.S. PATENT DOCUMENTS

| 5,132,963 A | * | 7/1992 | Ungerboeck | H04B 3/23 |
| | | | | 379/406.01 |
| 5,633,863 A | * | 5/1997 | Gysel | H04B 3/23 |
| | | | | 370/290 |

(Continued)

OTHER PUBLICATIONS

Hsuan-Ting Ho et al., "Digital-to-analog conversion apparatus and method having signal calibration mechanism", U.S. Appl. No. 17/728,178.

*Primary Examiner* — Linh V Nguyen
(74) *Attorney, Agent, or Firm* — WPAT, P.C

(57) ABSTRACT

A calibrating device can mitigate the static mismatch error of a digital-to-analog converter (DAC), and includes a digital code generating circuit, the DAC, an analog-to-digital converter (ADC), a filter circuit, an indicating circuit, and a statistical circuit. The digital code generating circuit generates a digital code of N digital codes. The DAC generates an analog signal corresponding to one of N signal levels according to the digital code. The ADC generates a digital signal according to the analog signal. The filter circuit generates a gradient value according to the difference between the digital code and the digital signal. The indicating circuit generates a selection signal according to the digital code. The statistical circuit learns from the selection signal that the gradient value is corresponding to a $K^{th}$ digital code of the N digital codes, and determines whether the $K^{th}$ digital code should be adjusted according to the gradient value.

17 Claims, 2 Drawing Sheets

(58) Field of Classification Search
CPC ........ H03M 1/70; H03M 1/742; H03M 1/745;
H03M 1/747; H03M 3/33; H03M 3/388;
H03M 3/436; H03M 3/458; H03M 3/50;
H03M 7/30; H03M 7/3026; H03M 7/304;
H03M 7/3042; H04B 3/23; H04B 1/0475;
H04B 3/237; H04B 3/46; H04B 7/015
USPC .......................................... 341/118–121, 144
See application file for complete search history.

(56) References Cited

U.S. PATENT DOCUMENTS

| | | | | |
|---|---|---|---|---|
| 5,790,658 | A * | 8/1998 | Yip ........................ | H04B 3/237 |
| | | | | 370/290 |
| 6,259,680 | B1 * | 7/2001 | Blackwell ................ | H04B 3/23 |
| | | | | 370/286 |
| 6,317,419 | B1 * | 11/2001 | Olafsson ............ | H04L 25/4927 |
| | | | | 370/292 |
| 6,795,405 | B1 * | 9/2004 | Mladenovic ............. | H04B 3/23 |
| | | | | 379/406.01 |
| 7,003,027 | B2 * | 2/2006 | Lai ...................... | H04L 25/4927 |
| | | | | 375/222 |
| 7,027,592 | B1 * | 4/2006 | Straussnigg ............. | H04B 3/23 |
| | | | | 379/406.08 |
| 8,509,125 | B1 * | 8/2013 | Venkataraman ......... | H04B 3/20 |
| | | | | 379/406.01 |
| 2004/0208249 | A1 * | 10/2004 | Risbo .................... | H03M 3/388 |
| | | | | 375/243 |
| 2008/0266153 | A1 * | 10/2008 | Rychen ............... | H03M 1/1042 |
| | | | | 341/120 |
| 2009/0225912 | A1 * | 9/2009 | Shih ........................ | H04B 3/23 |
| | | | | 375/346 |

* cited by examiner

CALIBRATING DEVICE FOR DIGITAL-TO-ANALOG CONVERSION

BACKGROUND OF THE INVENTION

1. Field of the Invention

The present disclosure relates to a calibrating device for digital-to-analog conversion, especially to a calibrating device capable of mitigating the static mismatch error of a local digital-to-analog converter.

2. Description of Related Art

The variation in a process, voltage, and temperature (PVT) will cause a mismatch problem with respect to the scale and the pulse shape of the output of a digital-to-analog converter (DAC) (e.g., current DAC). A mismatch appears on the scale is called a static mismatch error and a mismatch appears on the pulse shape is called a dynamic mismatch error, wherein the static mismatch error will seriously affect the performance of a circuit system. When the above-mentioned DAC is a local DAC, the circuit system is a local circuit system including the local DAC.

SUMMARY OF THE INVENTION

An object of the present disclosure is to provide a calibrating device for digital-to-analog conversion, wherein the calibrating device is capable of mitigating the static mismatch error of a local digital-to-analog converter (DAC).

An embodiment of the calibrating device of the present disclosure includes a digital code generating circuit, a DAC, an analog-to-digital converter (ADC), a filter circuit, an indicating circuit, and a statistical circuit. The digital code generating circuit is configured to generate a digital code, wherein the digital code is one of N digital codes, N initial values of the N digital codes are inconsecutive digital values, and the N is an integer greater than one. The DAC is configured to generate an analog signal according to the digital code, wherein the DAC is the aforementioned local DAC and the analog signal is corresponding to one of N signal levels (e.g., voltage levels). The ADC is configured to generate a digital signal according to the analog signal. The filter circuit is coupled to the digital code generating circuit and the ADC, and configured to generate a gradient value according to a difference between the digital code and the digital signal, wherein the difference correlates with the static mismatch error of the DAC. The indicating circuit is configured to generate a selection signal according to the digital code. The statistical circuit is configured to learn from the selection signal that the gradient value is a $K^{th}$ gradient value corresponding to a $K^{th}$ digital code of the N digital codes, and configured to determine whether to request the digital code generating circuit to adjust the $K^{th}$ digital code according to the $K^{th}$ gradient value, wherein the K is a positive integer not greater than the N.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a calibrating device for digital-to-analog conversion. The calibrating device is capable of mitigating the static mismatch error of a local digital-to-analog converter (DAC). The static mismatch error means that: although the level of an output signal of the local DAC is supposed to be equal to a predetermined signal level ideally, the level of the output signal is actually equal to the predetermined signal level plus an unwanted offset due to the variation in a process, voltage, or temperature, which may bring a far-end signal receiving device difficulty in determining the level of the output signal accurately. The calibrating device of the present disclosure can be applied to a signal transmission device such as a 2.5GBase-T Ethernet device, and the signal transmission device is coupled to the above-mentioned far-end signal receiving device in a wired manner.

Figure 1:
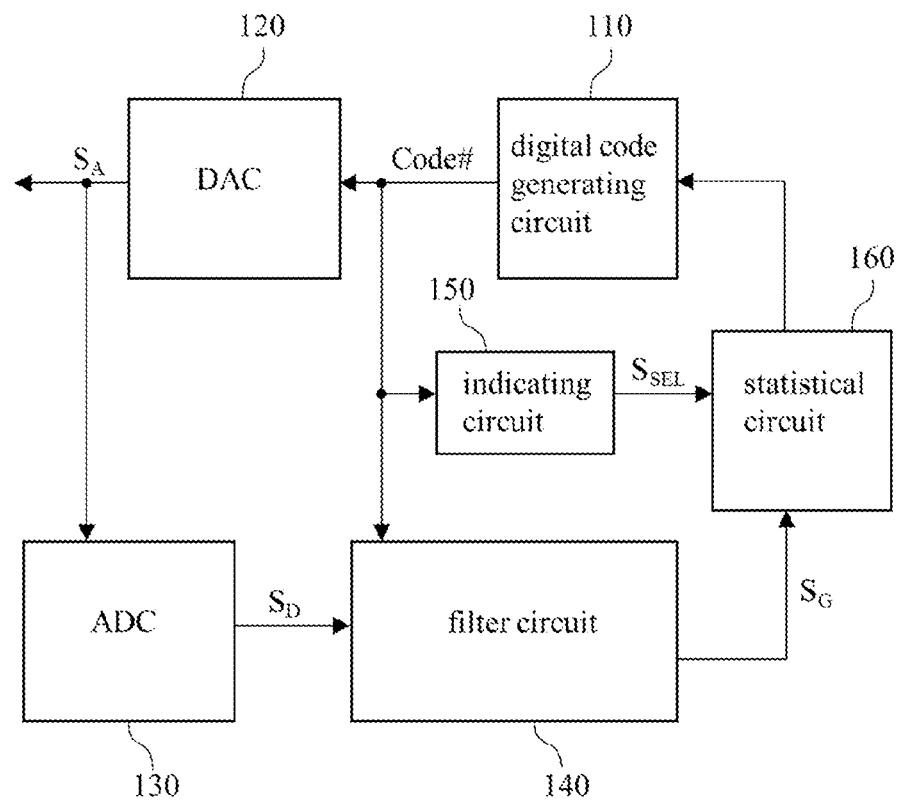
FIG. 1 shows a calibrating device for digital-to-analog conversion according to an embodiment of the present disclosure.

FIG. 1 shows an embodiment of the calibrating device of the present disclosure. As shown in FIG. 1, the calibration operation of the calibrating device 100 is a close loop operation. The calibrating device 100 includes a digital code generating circuit 110, a DAC 120, an analog-to-digital converter (ADC) 130, a filter circuit 140, an indicating circuit 150, and a statistical circuit 160. These circuits are described in detail in the following paragraphs.

In regard to the embodiment of FIG. 1, the digital code generating circuit 110 is configured to generate a digital code Code #, wherein the digital code Code # is one of N digital codes, each of the N digital codes is an initial value in the beginning of the calibration operation, the N initial values of the N digital codes are inconsecutive digital values, and the N is an integer greater than one. For example, the N digital codes are N values of M consecutive digital values, the M is an integer not less than $2^X$ (e.g., $2^8$), the X is an integer not less than three, the N is not less than $2^Y$ (e.g., $2^4$), and the Y is a positive integer not greater than (X−2); in brief, the N digital codes are a small part of the M consecutive digital values in this example. For example, the N initial values are at regular intervals. For example, the N is 17, the N digital codes are Code #1, Code #2, . . . , Code #16, and Code #17, the M is 256, the M consecutive digital values are 0, 1, 2, . . . , 254, and 255, and the interval between any two adjacent values of the N initial values is 15, the minimum value of the N initial values is 9, and accordingly the N initial values are as follows: Code #1=009, Code #2=024, Code #3=039, . . . , Code #16=234, and Code #17=249.

In regard to the embodiment of FIG. 1, the DAC 120 is configured to generate an analog signal $S_A$ according to the digital code Code #, wherein the DAC 120 is the aforementioned local DAC. The analog signal $S_A$ is corresponding to one of N signal levels (e.g., voltage levels), and the N signal levels are corresponding to the N digital codes respectively. For example, the N digital codes are N values of M consecutive digital values, the M is equal to $2^X$ (e.g., $2^8$), and the DAC 120 is a X-bits DAC (e.g., 8-bits DAC). The DAC 120 itself is a known/self-developed circuit, and its detail is beyond the scope of the present disclosure.

In regard to the embodiment of FIG. 1, the ADC 130 is configured to generate a digital signal $S_D$ according to the analog signal $S_A$. The ADC 130 itself is a known/self-developed circuit, and its detail is beyond the scope of the present disclosure.

In regard to the embodiment of FIG. 1, the filter circuit 140 is coupled to the digital code generating circuit 110 and the ADC 130, and configured to generate a gradient value $S_G$ according to a difference between the digital code Code # and the digital signal $S_D$, wherein the difference correlates with the static mismatch error of the DAC 120. For example, the filter circuit 140 applies a Least Mean Squares (LMS) algorithm to generate the LMS value (i.e., the gradient value $S_G$) of an error signal $S_{ERR}$ as mentioned in a later paragraph. The LMS algorithm is known in this technical field, and its detail is beyond the scope of the present disclosure.

Figure 2:
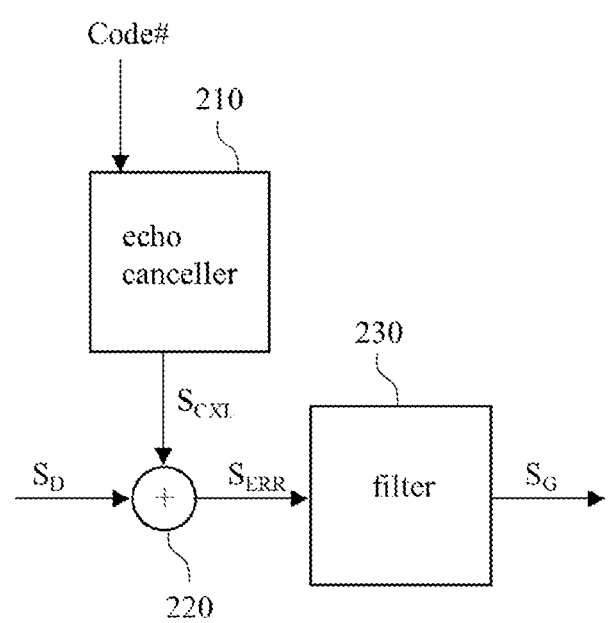
FIG. 2 shows an embodiment of the filter circuit.

FIG. 2 shows an embodiment of the filter circuit 140, and this embodiment includes an echo canceler 210, an error signal generating circuit 220, and a filter 230. The echo canceler 210 is configured to generate a cancellation signal $S_{CXL}$ according to the digital code Code #. The error signal generating circuit 220 (e.g., adder or subtractor) is configured generate an error signal $S_{ERR}$ according to the cancellation signal $S_{CXL}$ and the digital signal $S_D$. The filter 230 is configured to generate the aforementioned gradient value $S_G$ according to the error signal $S_{ERR}$. An embodiment of the echo canceler 210 is a specific filter, and the coefficients (e.g., [0 1 0 01]) of the filter 230 is a mirror image of the coefficients (e.g., [0 0 1 01]) of the specific filter. Each of the echo canceler 210, the error signal generating circuit 220, and the filter 230 alone is a known/self-developed circuit, and its detail is beyond the scope of the present disclosure.

In regard to the embodiment of FIG. 1, the indicating circuit 150 is configured to generate a selection signal $S_{SEL}$ according to the digital code Code #. The selection signal $S_{SEL}$ indicates that the digital code Code # is a certain digital code of the N digital codes. For example, the indicating circuit 150 includes a delay circuit (not shown); the delay circuit delays the transmission of the digital code Code # and thereby generate a delayed digital code as the selection signal $S_{SEL}$; and the delay amount caused by the delay circuit is equal to the delay amount caused by the filter circuit 140; in brief, the indicating circuit 150 here is for notifying the statistical circuit 160 that the gradient value $S_G$ is corresponding to which digital code. The indicating circuit 150 itself is a known/self-developed circuit, and its detail is beyond the scope of the present disclosure. It is noted that the indicating circuit 150 can be included in the digital code generating circuit 110, or be set outside the digital code generating circuit 110.

In regard to the embodiment of FIG. 1, the statistical circuit 160 is configured to learn from the selection signal $S_{SEL}$ that the gradient value $S_G$ is a $K^{th}$ gradient value corresponding to a $K^{th}$ digital code of the N digital codes, and configured to determine whether to request the digital code generating circuit 110 to adjust the $K^{th}$ digital code according to the $K^{th}$ gradient value, wherein the K is a positive integer not greater than the N. It is noted that the statistical circuit 160 can be included in the digital code generating circuit 110 or be set outside the digital code generating circuit 110.

On the basis of the above description, in an exemplary implementation the statistical circuit 160 updates a $K^{th}$ accumulated gradient value (GradAcc #K) according to the $K^{th}$ gradient value (Grad #K), and then determines whether the $K^{th}$ accumulated gradient value is greater than a $K^{th}$ positive threshold value (+THD #K) or less than a $K^{th}$ negative threshold value (−THD #K), wherein the $K^{th}$ accumulated gradient value and the $K^{th}$ gradient value in the beginning of the calibration operation are the same or in a predetermined relation, and each gradient value is assigned an accumulated gradient value, a positive threshold value, and a negative threshold value for the calibration operation; and when the $K^{th}$ accumulated gradient value is greater than the $K^{th}$ positive threshold value or less than the $K^{th}$ negative threshold value, the statistical circuit 160 requests the digital code generating circuit 110 to adjust the $K^{th}$ digital code and requests the digital code generating circuit 110 to reset the $K^{th}$ accumulated gradient value or update both the $K^{th}$ positive threshold value and the $K^{th}$ negative threshold value. It is noted that the absolute value of the $K^{th}$ positive threshold value can be equal to the absolute value of the $K^{th}$ negative threshold value, but the present invention is not limited thereto. It is also noted that all positive threshold values (i.e., +THD #1~+THD #N) can be the same and all negative threshold values (i.e., −THD #1~−THD #N) can be the same, but the present invention is not limited thereto.

In an exemplary implementation, every time the $K^{th}$ gradient value (Grad #K) is updated, the statistical circuit 160 subtracts a product from a current value of the $K^{th}$ accumulated gradient value (GradAcc #K) to update the $K^{th}$ accumulated gradient value, wherein the product is equal to a coefficient (Mu) (e.g., $2^{-10}$) multiplied by the $K^{th}$ gradient value (Grad #K). The above calculation can be expressed as follows:

$$\text{GradAcc } \#K = \text{GradAcc } \#K - \text{Mu} \times \text{Grad } \#K \quad \text{(eq. 1)}$$

In an exemplary implementation, when the $K^{th}$ accumulated gradient value (GradAcc #K) is greater than the $K^{th}$ positive threshold value, this implies that the $K^{th}$ digital code (Code #K) becomes excessively large as time goes by; accordingly, the statistical circuit 160 requests the digital code generating circuit 110 to decrease the $K^{th}$ digital code and requests the digital code generating circuit 110 to reset the $K^{th}$ accumulated gradient value or update both the $K^{th}$ positive threshold value and the $K^{th}$ negative threshold value. For example, the digital code generating circuit 110 subtracts one from a current value of the $K^{th}$ digital code and thereby decreases the $K^{th}$ digital code, which can be expressed as follows:

$$\text{GradAcc } \#K \geq +\text{THD } \#K \rightarrow \text{Code } \#K = \text{Code } \#K - 1 \quad \text{(eq. 2)}$$

In an exemplary implementation, when the $K^{th}$ accumulated gradient value (GradAcc #K) is less than the $K^{th}$ negative threshold value, this implies that the $K^{th}$ digital code (Code #K) becomes excessively small as time goes by; accordingly, the statistical circuit 160 requests the digital code generating circuit 110 to increase the $K^{th}$ digital code and requests the digital code generating circuit 110 to reset the $K^{th}$ accumulated gradient value or update both the $K^{th}$ positive threshold value and the $K^{th}$ negative threshold value. For example, the digital code generating circuit 110 adds up a current value of the $K^{th}$ digital code and one and thereby increases the $K^{th}$ digital code, which can be expressed as follows:

$$\text{GradAcc } \#K \leq -\text{THD } \#K \rightarrow \text{Code } \#K = \text{Code } \#K + 1 \quad \text{(eq. 3)}$$

In an exemplary implementation, after the adjustment of the $K^{th}$ digital code, the statistical circuit 160 resets the $K^{th}$ accumulated gradient value (GradAcc #K) and thereby makes the $K^{th}$ accumulated gradient value be zero or a predetermined value. In an exemplary implementation, after the adjustment of the $K^{th}$ digital code, the statistical circuit 160 adds a $K^{th}$ initial threshold value (e.g., |+THD #K|) to each of the $K^{th}$ positive threshold value and the $K^{th}$ negative threshold value in response to the increase in the $K^{th}$ digital code or subtracts the $K^{th}$ initial threshold value from each of the $K^{th}$ positive threshold value and the $K^{th}$ negative threshold value in response to the decrease in the $K^{th}$ digital code, and thereby updates the $K^{th}$ positive threshold value (e.g., +THD #K+(+THD #K)=+2THD #K, or +THD #K−(+THD #K)=0) and updates the $K^{th}$ negative threshold value (e.g., −THD #K+(+THD #K)=0, or −THD #K−(+THD #K)=−2THD #K).

It is noted that the output of the DAC 120, that is to say the input of the ADC 130, and the output of the filter circuit 140 may interact with each other and change interdependently, which may lead to the overflow of hardware. In an exemplary implementation, at least two of the N digital codes (e.g., the $N^{th}$ digital code (i.e., the maximum digital code) of the N digital codes and the $1^{st}$ digital code (i.e., the minimum digital code) of the N digital codes) are fixed, and this makes an anchoring effect and prevents the overflow of hardware. In this exemplary implementation, the K is less than the N but greater than one.

In an exemplary implementation, the N digital codes are 17 values among 256 consecutive digital values. Each of the 17 digital codes (Code #1~Code #17) is an initial value in the beginning of the calibration operation, and the 17 initial values of the 17 digital codes are 009, 024, 039, 054, 069, 084, 099, 114, 129, 144, 159, 174, 189, 204, 219, 234, 249 in order, wherein the $1^{st}$ digital code (i.e., 009) and the $17^{th}$ digital code (i.e., 249) remain unchanged to achieve the aforementioned anchoring effect. Table 1 shows the 17 digital codes and the way to adjust the 17 digital codes, wherein THD denotes the aforementioned positive threshold value and −THD denotes the aforementioned negative threshold value.

TABLE 1

| 17 digital codes | the way to adjust digital codes |
|---|---|
| Code#17 | fixed |
| Code#16 | if GradAcc#16 ≥ +THD → Code#16 = Code#16 − 1 → reset GradAcc#16 |
|  | if GradAcc#16 ≤ −THD → Code#16 = Code#16 + 1 → reset GradAcc#16 |
| Code#15 | if GradAcc#15 ≥ +THD → Code#15 = Code#15 − 1 → reset GradAcc#15 |
|  | if GradAcc#15 ≤ −THD → Code#15 = Code#15 + 1 → reset GradAcc#15 |
| Code#14 | if GradAcc#14 ≥ +THD → Code#14 = Code#14 − 1 → reset GradAcc#14 |
|  | if GradAcc#14 ≤ −THD → Code#14 = Code#14 + 1 → reset GradAcc#14 |
| Code#13 | if GradAcc#13 ≥ +THD → Code#13 = Code#13 − 1 → reset GradAcc#13 |
|  | if GradAcc#13 ≤ −THD → Code#13 = Code#13 + 1 → reset GradAcc#13 |
| Code#12 | if GradAcc#12 ≥ +THD → Code#12 = Code#12 − 1 → reset GradAcc#12 |
|  | if GradAcc#12 ≤ −THD → Code#12 = Code#12 + 1 → reset GradAcc#12 |
| Code#11 | if GradAcc#11 ≥ +THD → Code#11 = Code#11 − 1 → reset GradAcc#11 |
|  | if GradAcc#11 ≤ −THD → Code#11 = Code#11 + 1 → reset GradAcc#11 |
| Code#10 | if GradAcc#10 ≥ +THD → Code#10 = Code#10 − 1 → reset GradAcc#10 |
|  | if GradAcc#10 ≤ −THD → Code#10 = Code#10 + 1 → reset GradAcc#10 |
| Code#9 | if GradAcc#09 ≥ +THD → Code#09 = Code#09 − 1 → reset GradAcc#09 |
|  | if GradAcc#09 ≤ −THD → Code#09 = Code#09 + 1 → reset GradAcc#09 |
| Code#8 | if GradAcc#08 ≥ +THD → Code#08 = Code#08 − 1 → reset GradAcc#08 |
|  | if GradAcc#08 ≤ −THD → Code#08 = Code#08 + 1 → reset GradAcc#08 |
| Code#7 | if GradAcc#07 ≥ +THD → Code#07 = Code#07 − 1 → reset GradAcc#07 |
|  | if GradAcc#07 ≤ −THD → Code#07 = Code#07 + 1 → reset GradAcc#07 |
| Code#6 | if GradAcc#06 ≥ +THD → Code#06 = Code#06 − 1 → reset GradAcc#06 |
|  | if GradAcc#06 ≤ −THD → Code#06 = Code#06 + 1 → reset GradAcc#06 |
| Code#5 | if GradAcc#05 ≥ +THD → Code#05 = Code#05 − 1 → reset GradAcc#05 |
|  | if GradAcc#05 ≤ −THD → Code#05 = Code#05 + 1 → reset GradAcc#05 |
| Code#4 | if GradAcc#04 ≥ +THD → Code#04 = Code#04 − 1 → reset GradAcc#04 |
|  | if GradAcc#04 ≤ −THD → Code#04 = Code#04 + 1 → reset GradAcc#04 |
| Code#3 | if GradAcc#03 ≥ +THD → Code#03 = Code#03 − 1 → reset GradAcc#03 |
|  | if GradAcc#03 ≤ −THD → Code#03 = Code#03 + 1 → reset GradAcc#03 |
| Code#2 | if GradAcc#02 ≥ +THD → Code#02 = Code#02 − 1 → reset GradAcc#02 |
|  | if GradAcc#02 ≤ −THD → Code#02 = Code#02 + 1 → reset GradAcc#02 |
| Code#1 | fixed |

In an exemplary implementation, if the aforementioned $K^{th}$ digital code is adjusted to be a certain value most frequently or stays at the certain value for longest time in a predetermined period of time, the statistical circuit 160 requests the digital code generating circuit 110 to make the $K^{th}$ digital code be the certain value and stop/suspend updating the $K^{th}$ digital code. In this way, all of the N digital codes can be adjusted appropriately.

It should be noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the calibrating device of the present disclosure can mitigate the static mismatch error of a local DAC.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A calibrating device for digital-to-analog conversion, the calibrating device being capable of mitigating a static mismatch error of a local digital-to-analog converter (DAC), the calibrating device comprising:
   a digital code generating circuit configured to generate a digital code, wherein the digital code is one of N digital codes, N initial values of the N digital codes are inconsecutive digital values, and the N is an integer greater than one;
   a DAC configured to generate an analog signal according to the digital code, wherein the DAC is the local DAC and the analog signal is corresponding to one of N signal levels;
   an analog-to-digital converter (ADC) configured to generate a digital signal according to the analog signal;

a filter circuit coupled to the digital code generating circuit and the ADC, and configured to generate a gradient value according to a difference between the digital code and the digital signal, wherein the difference correlates with the static mismatch error of the DAC;

an indicating circuit configured to generate a selection signal according to the digital code; and a statistical circuit configured to learn from the selection signal that the gradient value is a $K^{th}$ gradient value corresponding to a $K^{th}$ digital code of the N digital codes, and configured to determine whether to request the digital code generating circuit to adjust the $K^{th}$ digital code according to the $K^{th}$ gradient value, wherein the K is a positive integer not greater than the N.

2. The calibrating device of claim 1, wherein the N digital codes are N values of M consecutive digital values, the M is an integer not less than $2^X$, the X is an integer not less than three, the N is not less than $2^Y$, and the Y is a positive integer not greater than (X−2).

3. The calibrating device of claim 1, wherein an $N^{th}$ digital code of the N digital codes and a first digital code of the N digital codes are fixed, the $N^{th}$ digital code is a maximum digital code among the N digital codes, the first digital code is a minimum digital code among the N digital cods, and the K is less than the N but greater than one.

4. The calibrating device of claim 1, wherein the N initial values are at regular intervals.

5. The calibrating device of claim 1, wherein the filter circuit applies a Least Mean Squares (LMS) algorithm.

6. The calibrating device of claim 1, wherein the filter circuit includes:

an echo canceler configured to generate a cancellation signal according to the digital code;

an error signal generating circuit configured generate an error signal according to the cancellation signal and the digital signal; and a filter configured to generate the gradient value according to the error signal.

7. The calibrating device of claim 6, wherein the echo canceler is another filter, and coefficients of the filter is a mirror image of coefficients of the another filter.

8. The calibrating device of claim 1, wherein the indicating circuit includes a delay circuit, and a first delay amount caused by the delay circuit is equal to a second delay amount caused by the filter circuit.

9. The calibrating device of claim 1, wherein the statistical circuit updates a $K^{th}$ accumulated gradient value according to the $K^{th}$ gradient value, and then determines whether the $K^{th}$ accumulated gradient value is greater than a $K^{th}$ positive threshold value or less than a $K^{th}$ negative threshold value; and when the $K^{th}$ accumulated gradient value is greater than the $K^{th}$ positive threshold value or less than the $K^{th}$ negative threshold value, the statistical circuit requests the digital code generating circuit to adjust the $K^{th}$ digital code and to reset the $K^{th}$ accumulated gradient value or update the $K^{th}$ positive threshold value and the $K^{th}$ negative threshold value.

10. The calibrating device of claim 9, wherein the statistical circuit subtracts a product from a current value of the $K^{th}$ accumulated gradient value to update the $K^{th}$ accumulated gradient value, and the product is equal to a coefficient multiplied by the $K^{th}$ gradient value.

11. The calibrating device of claim 9, wherein when the $K^{th}$ accumulated gradient value is greater than the $K^{th}$ positive threshold value, the statistical circuit requests the digital code generating circuit to decrease the $K^{th}$ digital code.

12. The calibrating device of claim 11, wherein the digital code generating circuit subtracts one from a current value of the $K^{th}$ digital code and thereby decreases the $K^{th}$ digital code.

13. The calibrating device of claim 9, wherein when the $K^{th}$ accumulated gradient value is less than the $K^{th}$ negative threshold value, the statistical circuit requests the digital code generating circuit to increase the $K^{th}$ digital code.

14. The calibrating device of claim 13, wherein the digital code generating circuit adds up a current value of the $K^{th}$ digital code and one and thereby increases the $K^{th}$ digital code.

15. The calibrating device of claim 9, wherein the statistical circuit resets the $K^{th}$ accumulated gradient value and thereby makes the $K^{th}$ accumulated gradient value be zero.

16. The calibrating device of claim 9, wherein the statistical circuit adds a $K^{th}$ initial value to each of the $K^{th}$ positive threshold value and the $K^{th}$ negative threshold value or subtracts the $K^{th}$ initial value from each of the $K^{th}$ positive threshold value and the $K^{th}$ negative threshold value, and thereby updates the $K^{th}$ positive threshold value and the $K^{th}$ negative threshold value.

17. The calibrating device of claim 1, wherein in a circumstance that the $K^{th}$ digital code is adjusted to be a certain value most frequently or stays at the certain value for longest time in a predetermined period of time, the statistical circuit requests the digital code generating circuit to make the $K^{th}$ digital code be the certain value.

* * * * *